(12) United States Patent
Kwon et al.

(10) Patent No.: US 9,390,992 B2
(45) Date of Patent: Jul. 12, 2016

(54) SEMICONDUCTOR PACKAGES INCLUDING A METAL LAYER BETWEEN FIRST AND SECOND SEMICONDUCTOR CHIPS

(71) Applicants: Heungkyu Kwon, Seongnam-si (KR); Sangho An, Suwon-si (KR)

(72) Inventors: Heungkyu Kwon, Seongnam-si (KR); Sangho An, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 14/289,814

(22) Filed: May 29, 2014

(65) Prior Publication Data

US 2015/0014862 A1 Jan. 15, 2015

(30) Foreign Application Priority Data

Jul. 11, 2013 (KR) ........................ 10-2013-0081632

(51) Int. Cl.

| | |
|---|---|
| *H01L 23/13* | (2006.01) |
| *H01L 23/31* | (2006.01) |
| *H01L 23/498* | (2006.01) |
| *H01L 23/552* | (2006.01) |
| *H01L 25/065* | (2006.01) |

(Continued)

(52) U.S. Cl.
CPC ...... *H01L 23/3128* (2013.01); *H01L 23/49816* (2013.01); *H01L 23/552* (2013.01); *H01L 25/0657* (2013.01); *H01L 25/105* (2013.01); *H01L 24/16* (2013.01); *H01L 24/29* (2013.01); *H01L 24/32* (2013.01); *H01L 24/48* (2013.01); *H01L 24/73* (2013.01); *H01L 2224/131* (2013.01); *H01L 2224/16225* (2013.01); *H01L 2224/16227* (2013.01); *H01L 2224/2919* (2013.01); *H01L 2224/32145* (2013.01); *H01L 2224/32225* (2013.01); *H01L 2224/32245* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/0652* (2013.01); *H01L 2225/06517* (2013.01); *H01L 2225/06537* (2013.01); *H01L 2225/06568* (2013.01); *H01L 2225/06572* (2013.01); *H01L 2225/06582* (2013.01); *H01L 2225/06586* (2013.01); *H01L 2225/1023* (2013.01); *H01L 2225/1058* (2013.01); *H01L 2225/1088* (2013.01); *H01L 2924/12042* (2013.01); *H01L 2924/15153* (2013.01); *H01L 2924/15156* (2013.01); *H01L 2924/15192* (2013.01); *H01L 2924/15311* (2013.01); *H01L 2924/19107* (2013.01)

(58) Field of Classification Search
None
See application file for complete search history.

(56) References Cited

U.S. PATENT DOCUMENTS 6,737,750 B1 * 5/2004 Hoffman et al. .............. 257/777
7,816,183 B2 10/2010 Kawata (Continued)

FOREIGN PATENT DOCUMENTS

| JP | 2003-115578 | 4/2003 |
|---|---|---|
| JP | 2004228323 A | 8/2004 |

(Continued)

*Primary Examiner* — Fei Fei Yeung Lopez
(74) *Attorney, Agent, or Firm* — Myers Bigel & Sibley, P.A.

(57) ABSTRACT

Semiconductor packages are provided. A semiconductor package may include a wiring board and a first semiconductor chip on the wiring board. Moreover, the semiconductor package may include a metal layer on the first semiconductor chip and a second semiconductor chip on the metal layer. The metal layer may be between the first and second semiconductor chips.

20 Claims, 7 Drawing Sheets

(51) Int. Cl.
    *H01L 25/10* (2006.01)
    *H01L 23/00* (2006.01)

(56) References Cited

U.S. PATENT DOCUMENTS

2004/0140552 A1 7/2004 Kuroda et al.
2006/0091517 A1 5/2006 Yoo et al.
2006/0102992 A1 5/2006 Kwon et al.
2010/0072600 A1 3/2010 Gerber

FOREIGN PATENT DOCUMENTS

| JP | 2005-303056 | 10/2005 |
| KR | 1020020043395 A | 6/2002 |
| KR | 1020060039044 A | 5/2006 |
| KR | 1020110040102 A | 4/2011 |

* cited by examiner

SEMICONDUCTOR PACKAGES INCLUDING A METAL LAYER BETWEEN FIRST AND SECOND SEMICONDUCTOR CHIPS

CROSS-REFERENCE TO RELATED APPLICATION

This U.S. non-provisional patent application claims priority under 35 U.S.C. §119 to Korean Patent Application No. 10-2013-0081632, filed on Jul. 11, 2013, the disclosure of which is hereby incorporated herein by reference in its entirety.

BACKGROUND

The present disclosure herein relates to semiconductor packages. It is a trend of the electronics industry to inexpensively fabricate lighter, smaller, faster, more multi-functional, higher performance, and higher reliability electronic products. A package technique used to fabricate such products may be an important technique for achieving this trend. A chip scale package (CSP) technique may provide a relatively small semiconductor package of a semiconductor chip scale.

High capacity of the semiconductor packages is also being demanded along with the small size of the semiconductor packages. Techniques capable of integrating many cells in a limited area of a semiconductor chip may be used to increase a memory capacity of a semiconductor package. These techniques, however, may need a high level precision for accurate and fine widths and spaces. Thus, research has been conducted for methods of realizing high integration of semiconductor packages using recently developed semiconductor chips or semiconductor packages, for example, a multi-chip stacked package including three-dimensionally stacked semiconductor chips or a stack type semiconductor package including three-dimensionally stacked semiconductor packages.

SUMMARY

Embodiments of the inventive concepts may provide semiconductor packages capable of reducing their thicknesses by simplified processes and increasing their reliability. Various embodiments of the present inventive concepts provide a semiconductor package that may include a wiring board having a first surface and a second surface opposite the first surface. The semiconductor package may include a first semiconductor chip that is flip-chip mounted on the first surface of the wiring board. The semiconductor package may include a metal layer on the first semiconductor chip, the metal layer having a first width that is wider than a second width of the first semiconductor chip. The semiconductor package may include a second semiconductor chip on the metal layer. Moreover, the semiconductor package may include a first bonding wire configured to electrically connect the metal layer to a first ground interconnection of the wiring board, and a second bonding wire configured to electrically connect the second semiconductor chip to a second ground interconnection of the wiring board. The second ground interconnection may be electrically isolated from the first ground interconnection.

In various embodiments, the semiconductor package may include a first adhesive layer between the metal layer and the first semiconductor chip, and a second adhesive layer between the metal layer and the second semiconductor chip. In some embodiments, the second semiconductor chip may include a third width that is narrower than the first width of the metal layer. The third width of the second semiconductor chip may be substantially equal to or wider than the second width of the first semiconductor chip. Additionally or alternatively, the metal layer may include a recessed portion on which the second semiconductor chip is mounted, and an edge portion adjacent the recessed portion, the edge portion including a first thickness that is thicker than a second thickness of the recessed portion.

According to various embodiments, the wiring board may include first connection pads on the first surface, and second connection pads on the second surface. The first connection pads may include a signal connection pad electrically connected to the first and second semiconductor chips and configured to provide electrical signal transmission, and ground connection pads electrically connected to the first and second semiconductor chips and configured to provide grounding. The second connection pads may include a signal external connection pad electrically connected to an external circuit and configured to provide electrical signal transmission, and a ground external connection pad electrically connected to the external circuit and configured to provide grounding. In some embodiments, the semiconductor package may include external connection terminals on respective ones of the second connection pads.

In various embodiments, the semiconductor package may include an underfill that is between the wiring board and the first semiconductor chip. In some embodiments, the semiconductor package may include a molding portion that is on the first surface of the wiring board, the first and second semiconductor chips, and the first and second bonding wires. The wiring board may be a wiring board of a lower package of the semiconductor package. Moreover, the semiconductor package may include an upper package, and one of the first connection pads of the wiring board may include a stack-connection pad that is electrically connected to the upper package.

According to various embodiments, the wiring board of the lower package may be a first wiring board. The upper package may include a second wiring board, and at least one third semiconductor chip mounted on a surface of the second wiring board. In some embodiments, the first, second, and at least one third semiconductor chips may be configured to perform different respective functions.

In various embodiments, the molding portion may be a first molding portion of the lower package, and the upper package may include a second molding portion on the surface of the second wiring board and on the at least one third semiconductor chip. Moreover, the surface of the second wiring board may be a first surface of the second wiring board, the second wiring board may include a second surface opposite the first surface of the second wiring board, and the stack-connection pad of the first wiring board may be electrically connected to the second surface of the second wiring board via a stack-connection terminal in an opening in the molding portion.

A semiconductor package, according to various embodiments, may include a wiring board and a first semiconductor chip on the wiring board. The semiconductor package may include a metal layer, including a recessed portion thereof, on the first semiconductor chip. Moreover, the semiconductor package may include a second semiconductor chip on the recessed portion of the metal layer, and the metal layer may be between the first and second semiconductor chips. In some embodiments, the first semiconductor chip may be flip-chip mounted on the wiring board. Moreover, the metal layer may have a first width that is wider than a second width of the first semiconductor chip, and the metal layer may have an edge portion having a first thickness that is thicker than a second thickness of the recessed portion of the metal layer.

In various embodiments, the semiconductor package may include a first bonding wire connected to the edge portion of the metal layer and to the wiring board, and a second bonding wire connected to the second semiconductor chip and to the wiring board. Moreover, the semiconductor package may include first and second ground interconnections in the wiring board. The first and second bonding wires may be electrically connected to the first and second ground interconnections, respectively, and the second ground interconnection may be electrically isolated from the first ground interconnection.

According to various embodiments, the metal layer may extend continuously between the first and second semiconductor chips. Moreover, the first thickness of the edge portion of the metal layer may be thicker than a third thickness of the first semiconductor chip, and at least a portion of a sidewall of the second semiconductor chip may face an opposing sidewall of the edge portion of the metal layer. In some embodiments, the semiconductor package may include first and second semiconductor packages. The wiring board may be a first wiring board of the first semiconductor package, and the first semiconductor package may include the first and second semiconductor chips and the metal layer. Moreover, the second semiconductor package may include a second wiring board on the first semiconductor package, and a third semiconductor chip on the second wiring board.

BRIEF DESCRIPTION OF THE DRAWINGS

The inventive concepts will become more apparent in view of the attached drawings and accompanying detailed description.

DETAILED DESCRIPTION

Figure 1:
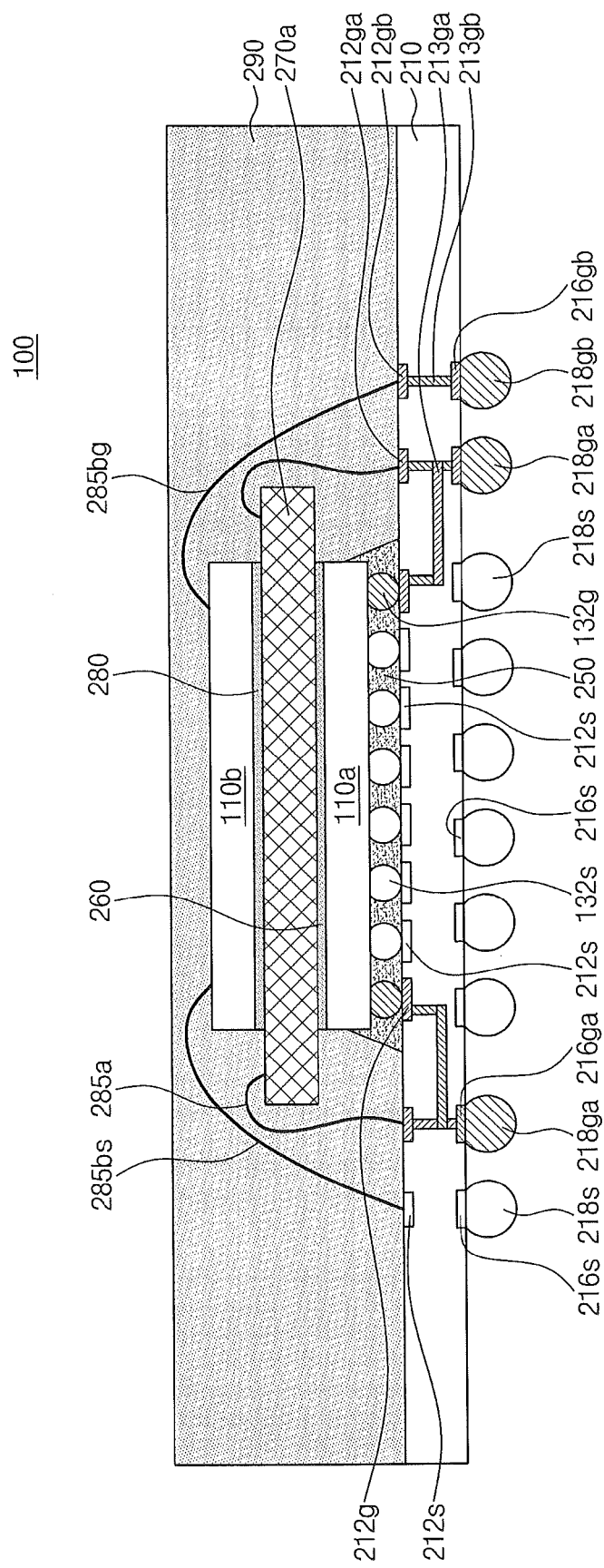
FIG. 1 is a cross-sectional view illustrating a semiconductor package according to various embodiments of the inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross-sectional view illustrating a semiconductor package according to various embodiments of the inventive concepts. Referring to FIG. 1, a semiconductor package 100 includes a wiring board 210, first and second semiconductor chips 110a and 110b sequentially stacked on a top surface of the wiring board 210, and a metal plate 270a (e.g., a metal layer/shield) disposed between the first and second semiconductor chips 110a and 110b.

The wiring board 210 may include a circuit pattern such as ground interconnections 213ga and 213gb. The circuit pattern may be disposed within the wiring board 210. The wiring board 210 may further include upper connection pads 212g, 212ga, 212gb, and 212s on its top surface and lower connection pads 216ga, 216gb, and 216s on its bottom surface. The upper and lower connection pads may be connected to the circuit pattern of the wiring board 210. The wiring board 210 may be a printed circuit board (PCB). However, the wiring board 210 is not limited to the PCB.

The upper connection pads 212g, 212ga, 212gb, and 212s may include a signal connection pad 212s electrically connected to the first and second semiconductor chips 110a and 110b for transmitting an electrical signal, and ground connection pads 212g, 212ga and 212gb for grounding. The lower connection pads 216ga, 216gb and 216s may include a signal external connection pad 216s electrically connected to an external circuit for transmitting an electrical signal, and ground external connection pads 216ga and 216gb for grounding. Here, the electrical signal may be an analog or digital signal related to a voltage, a current, and/or a frequency.

External connection terminals 218ga, 218gb and 218s may be provided on the lower connection pads 216ga, 216gb and 216s of the wiring board 210, respectively. The semiconductor package 100 may be electrically connected to the external circuit through the external connection terminals 218ga, 218gb and 218s. The external connection terminals 218ga, 218gb and 218s may include a signal external connection terminal 218s electrically connected to the external circuit for transmitting an electrical signal, and ground external connection terminals 218ga and 218gb for grounding. The external connection terminals 218ga, 218gb and 218s may be conductive bumps, solder balls, conductive spacers, a pin grid array (PGA), or any combination thereof. In particular, the external connection terminals 218ga, 218gb and 218s according to embodiments of the inventive concepts may be solder balls.

Bonding pads of a first semiconductor chip 110a may be electrically connected to the upper connection pads 212g and 212s of the wiring board 210 through mounting connection terminals 132g and 132s. In other words, the first semiconductor chip 110a may be mounted on the top surface of the wiring board 210 by a flip chip bonding technique. The mounting connection terminals 132g and 132s may include a signal connection terminal 132s electrically connected to the signal connection pad 212s of the wiring board 210 and a ground connection terminal 132g electrically connected to the ground connection pad 212g of the wiring board 210. The mounting connection terminals 132g and 132s may be conductive bumps, solder balls, conductive spacers, a pin grid array (PGA), or any combination thereof. In particular, the mounting connection terminals 132g and 132s according to embodiments of the inventive concepts may be solder balls.

The metal plate 270a may be provided on the first semiconductor chip 110a mounted by the flip chip bonding technique. A first adhesive layer 260 may be disposed between the metal plate 270a and the first semiconductor chip 110a. The metal plate 270a may include copper (Cu), aluminum (Al), nickel (Ni), chromium (Cr), or any combination thereof. For example, according to some embodiments of the inventive concepts, the metal plate 270a may include copper. The first adhesive layer 260 may include a cure type liquid epoxy or a film type adhesive material. However, the inventive concepts are not limited thereto.

The metal plate 270a may be electrically connected to the ground connection pads 212ga of the wiring board 210 through first bonding wires 285a. Thus, the metal plate 270a may correspond to a ground part. As a result, if the first semiconductor chip 110a is a high frequency chip corresponding to a wireless frequency band of 800 Megahertz (MHz) or 1.8 Gigahertz (GHz) of a frequency band of mobile communication or a base band chip corresponding to a middle frequency band of 100 MHz to 400 MHz, the metal plate 270a may effectively shield an electromagnetic wave emitted from the first semiconductor chip 110a in an upward direction and/or an electromagnetic wave input from an external system in a downward direction.

A second semiconductor chip 110b may be provided on the metal plate 270a with a second adhesive layer 280 therebetween. Bonding pads of the second semiconductor chip 110b may be electrically connected to the upper connection pads 212gb and 212s of the wiring board 210 through second bonding wires 285bg and 285bs. In other words, the second semiconductor chip 110b may be electrically connected to the upper connection pads 212gb and 212s of the wiring board 210 by a wire bonding technique. The second adhesive layer 280 may include a cure type liquid epoxy or a film type adhesive material. However, the inventive concepts are not limited thereto.

The second bonding wires 285bg and 285bs may include a signal bonding wire 285bs electrically connected to the signal connection pad 212s of the wiring board 210, and a ground bonding wire 285bg electrically connected to the ground connection pad 212gb of the wiring board 210. The first semiconductor chip 110a may be electrically connected to a first ground interconnection 213ga within the wiring board 210. The ground connection pad 212gb electrically connected to the second semiconductor chip 110b may be electrically connected to a second ground interconnection 213gb electrically separated from the first ground interconnection 213ga. In other words, the ground and/or a power of the first semiconductor chip 110a may be separated from the ground and/or a power of the second semiconductor chip 110b in the wiring board 210. Thus, an interference phenomenon between the first and second semiconductor chips 110a and 110b may be minimized/reduced.

The first and second semiconductor chips 110a and 110b may perform different functions from each other. Each of the first and second semiconductor chips 110a and 110b may be a volatile memory device (e.g., a dynamic random access memory (DRAM) device or a static random access memory (SRAM) device), a non-volatile memory device (e.g., a flash memory device), an optoelectronic device, a logic device, a communication device, a digital signal processor (DSP), or a system-on-chip (SOC).

The semiconductor package 100 may further include an underfill 250 provided between the wiring board 210 and the first semiconductor chip 110a. The underfill 250 may extend to further cover a sidewall of the first semiconductor chip 110a. The underfill 250 may be a flowable underfill or a non-flowable underfill. The flowable underfill may be provided between the wiring board 210 and the first semiconductor chip 110a by capillarity generated by a narrow space between the wiring board 210 and the first semiconductor chip 110a. Additionally, the underfill 250 may have a non-conductive paste (NCP) shape of which an entire portion is formed of an insulating material.

The semiconductor package 100 may further include a molding part 290 covering the first and second semiconductor chips 110a and 110b and the first and second bonding wires 285a, 285bg and 285bs. The molding part 290 may include an epoxy molding compound (EMC). However, the inventive concepts are not limited to this material of the molding part 290. The molding part 290 may have a sidewall coplanar with a sidewall of the wiring board 210, as illustrated in FIG. 1. However, the inventive concepts are not limited thereto. In some embodiments, the molding part 290 may have an inclined sidewall with respect to the top surface of the wiring board 210.

Figure 2:
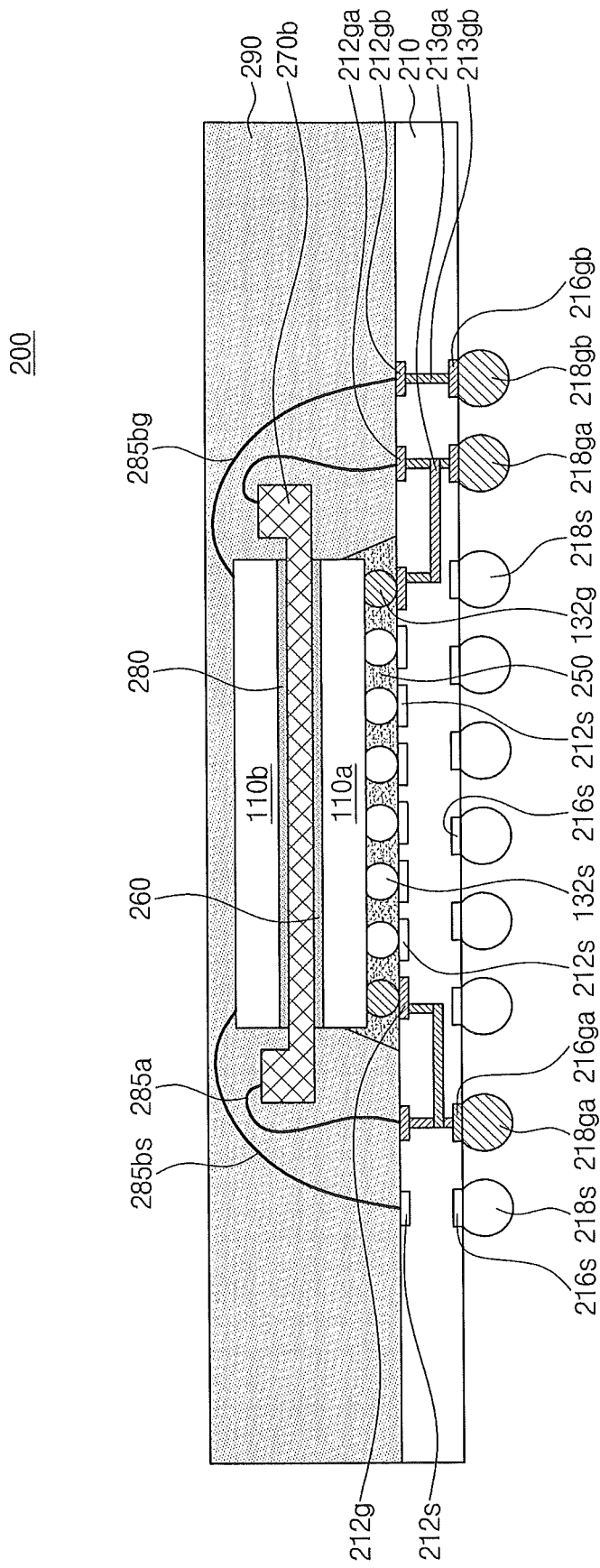
FIG. 2 is a cross-sectional view illustrating a semiconductor package according to various embodiments of the inventive concepts.

FIG. 2 is a cross-sectional view illustrating a semiconductor package according to various embodiments of the inventive concepts. In FIG. 2, the same elements as described in with respect to FIG. 1 will be indicated by the same reference numerals or the same designators, and the descriptions to the same elements may be omitted or mentioned briefly.

A semiconductor package 200 illustrated in FIG. 2 may have a metal plate 270b having a different structure from the metal plate 270a illustrated in FIG. 1. The metal plate 270b may include a concave part and an edge part surrounding the concave part. The concave part corresponds to a recessed part on which the second semiconductor chip 110b is mounted. The edge part has a thickness greater than that of the concave part. The concave part may be formed by half-etching/partially-etching a center region of a metal plate having a uniform thickness. As a result, the second semiconductor chip 110b is provided on the concave part corresponding to the recessed region, so that the semiconductor package 200 may be thinned.

The metal plate 270b may include one of various conductive metals (e.g., copper (Cu), aluminum (Al), nickel (Ni), chromium (Cr)) and any combination thereof. For example, in some embodiments, the metal plate 270b may include copper.

In the semiconductor package 200 according to the some embodiments, the semiconductor chip 110b is mounted on the concave part of the metal plate 270b corresponding to the recessed region, so that the thickness of the metal plate 270b may be reduced. Thus, a thinner semiconductor package 200 may be provided.

In the semiconductor packages 100 and/or 200 according to some embodiments of the inventive concepts, the ground and/or the power of the first semiconductor chip 110a may be separated from the ground and/or the power of the second semiconductor chip 110b. Thus, an interference phenomenon between the first and second semiconductor chips 110a and 110b may be minimized/reduced. As a result, the semiconductor packages 100 and/or 200 may be provided with improved reliability.

Additionally, the semiconductor packages 100 and/or 200 according to some embodiments of the inventive concepts have a structure configured to shield electromagnetic interference of/by the first semiconductor chip 110a mounted on the wiring board 210 by a flip chip technique. Thus, electromagnetic interference shielding ability of the semiconductor packages 100 and/or 200 for the first semiconductor chip 110a may be improved. As a result, the semiconductor packages 100 and/or 200 may be provided with improved reliability.

Furthermore, the semiconductor packages 100 and/or 200 have a structure configured to reduce or minimize the number of the bonding wires 285a, 285bs and 285bg. Thus, manufacturing processes of the semiconductor packages 100 and/or 200 may be simplified and radiation noise may be reduced or minimized. As a result, some embodiments of the inventive concepts provide the semiconductor packages 100 and/or 200 capable of improving reliability and of simplifying manufacturing processes.

Figure 3:
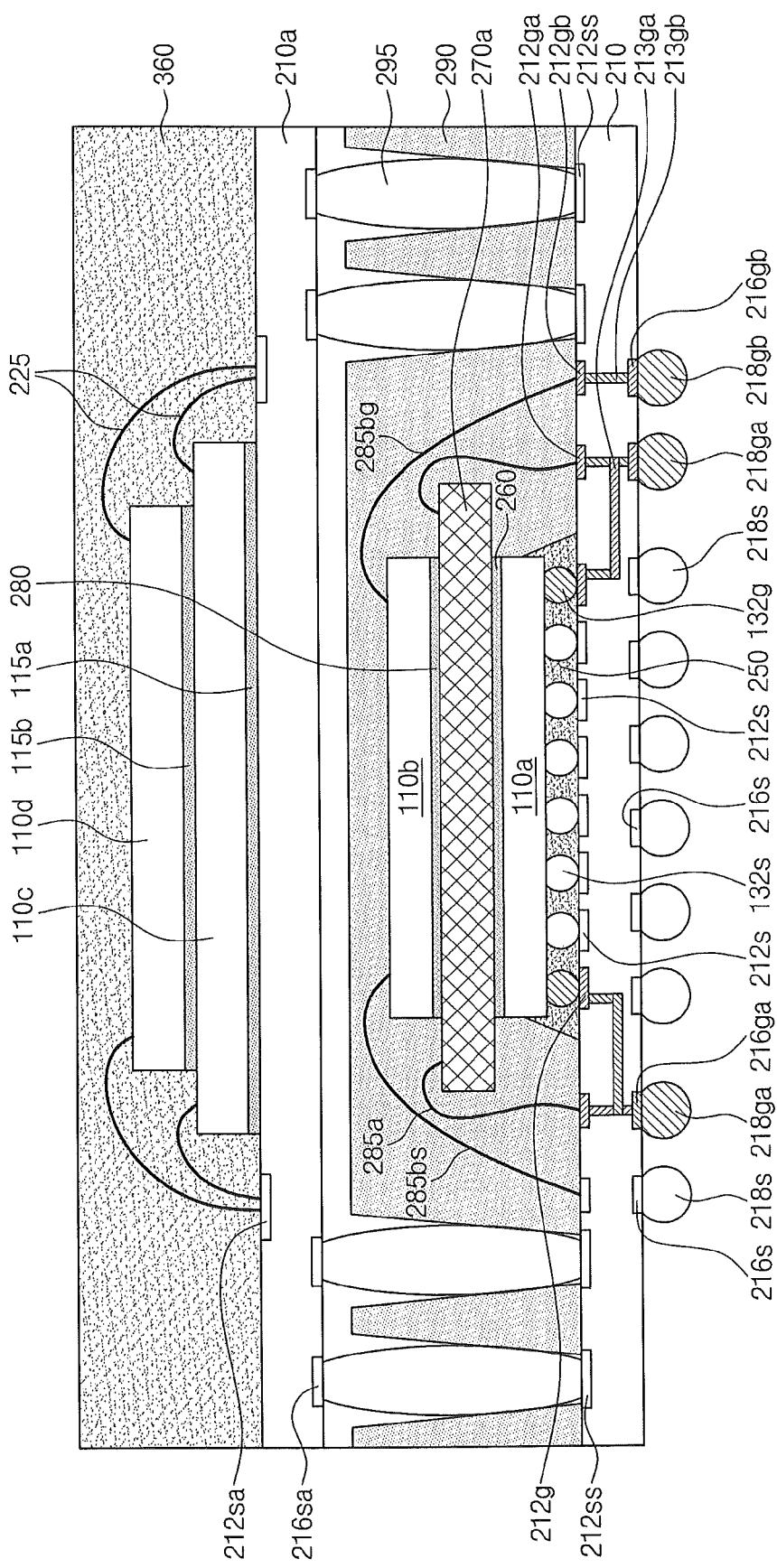
FIG. 3 is a cross-sectional view illustrating a semiconductor package according to various embodiments of the inventive concepts.

FIG. 3 is a cross-sectional view illustrating a semiconductor package according to various embodiments of the inventive concepts. In FIG. 3, the same elements as described with respect to FIGS. 1 and 2 will be indicated by the same reference numerals or the same designators, and the descriptions to the same elements may be omitted or mentioned briefly.

A semiconductor package according to FIG. 3 has a package-on-package (POP) structure further including an additionally stacked semiconductor package, unlike the semiconductor package 100 illustrated in FIG. 1. Upper connection pads 212g, 212ga, 212gb, 212s, and 212ss of a first wiring board 210 of a lower package may further include stack-connection pads 212ss electrically connected to a second wiring board 210a of an upper package. A first molding part 290 of the lower package may have openings respectively exposing the stack-connection pad 212ss. The openings may be formed by a laser drilling process (LDP), but the inventive concepts are not limited thereto.

The upper package may further include at least one third semiconductor chip 110c and/or 110d mounted on a top surface of the second wiring board 210a. In FIG. 3, the third semiconductor chips 110c and 110d are mounted on and electrically connected to the second wiring board 210a by a wire bonding technique using third adhesive layers 115a and 115b and third bonding wires 225. However, the inventive concepts are not limited thereto. Each of the third adhesive layers 115a and 115b may include a cure type liquid epoxy or a film type adhesive material, but the inventive concepts are not limited thereto.

The second wiring board 210a may include upper connection pads 212sa and lower connection pads 216sa. The upper connection pads 212sa may be disposed on the top surface of the second wiring board 210a and the lower connection pads 216sa may be disposed on a bottom surface of the second wiring board 210a. The upper and lower connection pads 212sa and 216sa may be electrically connected to a circuit pattern within the second wiring board 210a. The second wiring board 210a may be a printed circuit board, but the inventive concepts are not limited thereto.

The upper package may further include a second molding part 360 covering the top surface of the second wiring board 210a, the third semiconductor chips 110c and 110d, and the third bonding wires 225. The second molding part 360 may include an epoxy molding compound, but the inventive concepts are not limited thereto. The second molding part 360 is illustrated to have a sidewall coplanar with a sidewall of the second wiring board 210a in FIG. 3. However, the inventive concepts are not limited thereto. In some embodiments, the second molding part 36Q may have an inclined sidewall with respect to the top surface of the second wiring board 210a.

The stack-connection pads 212ss of the first wiring board 210 of the lower package may be electrically connected to the lower connection pads 216sa on the bottom surface of the second wiring board 210a of the upper package through stack-connection terminals 295 provided in the openings of the first molding part 290 of the lower package. Thus, the first and second semiconductor chips 110a and 110b of the lower package may be electrically connected to the third semiconductor chips 110c and 110d of the upper package. The lower and upper packages may have the same planar area or different planar areas from each other. The stack-connection terminals 295 may be conductive bumps, solder balls, conductive spacers, a pin grid array (PGA), or any combination thereof. For example, the stack-connection terminals 295 may be solder balls.

As described herein, the openings in the first molding part 290 may be formed by a laser drilling process. For example, the stack-connection terminals 295 may be formed on the stack-connection pads 212ss of the first wiring board 210 of the lower package and then the first molding part 290 may be formed to cover the stack-connection terminals 295. Thereafter, the laser drilling process may be performed to form the openings. Thus, the stack-connection terminals 295 may be exposed in the openings.

The first to third semiconductor chips 110a, 110b, 110c, and 110d may perform different functions from each other. In other words, each/any of the first to third semiconductor chips 110a, 110b, 110c, and 110d may be a volatile memory device (e.g., a DRAM device or a SRAM device), a non-volatile memory device (e.g., a flash memory device), an optoelectronic device, a logic device, a communication device, a digital signal processor (DSP), or a system-on-chip (SOC).

Figure 4:
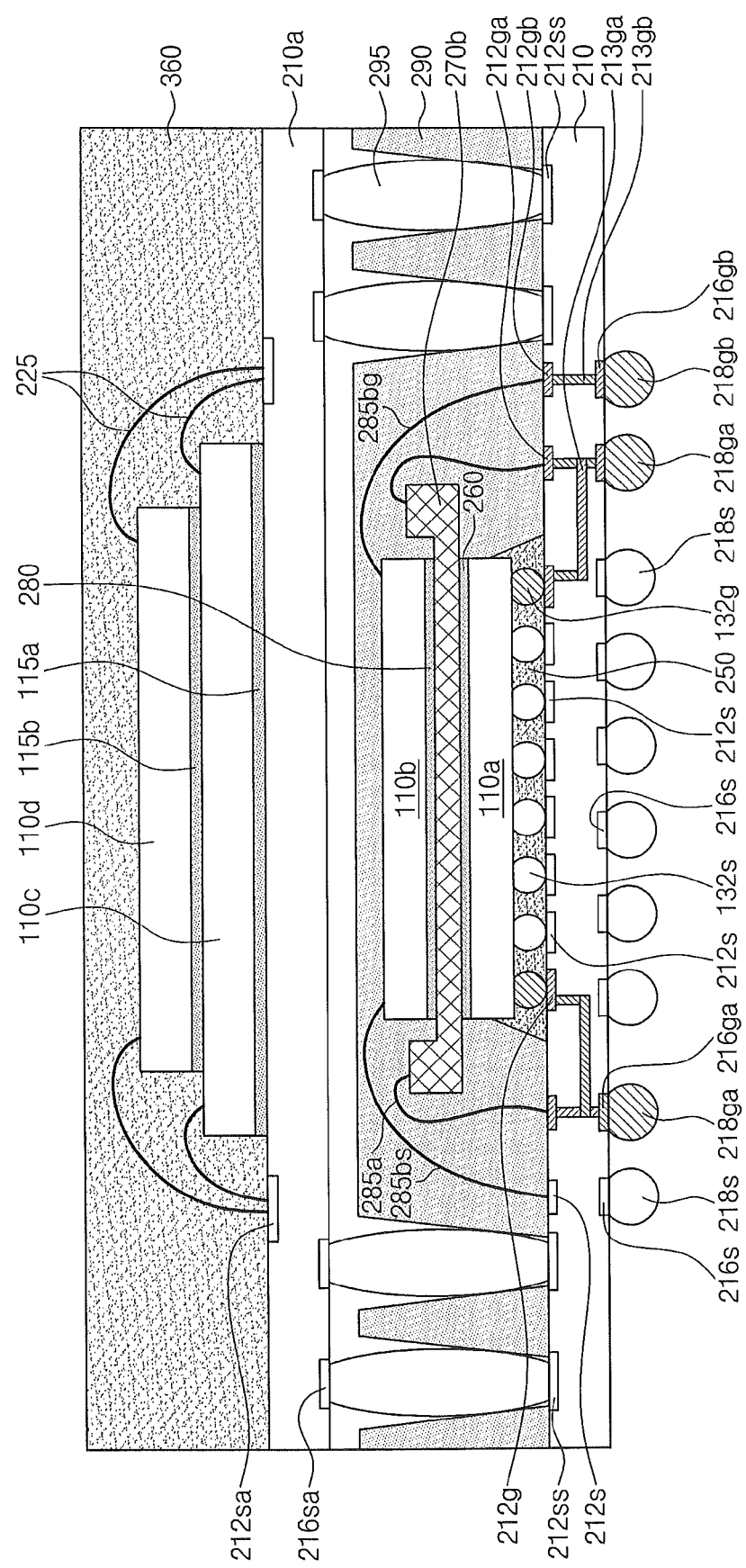
FIG. 4 is a cross-sectional view illustrating a semiconductor package according to various embodiments of the inventive concepts.

FIG. 4 is a cross-sectional view illustrating a semiconductor package according to various embodiments of the inventive concepts. In FIG. 4, the same elements as described with respect to FIGS. 1-3 will be indicated by the same reference numerals or the same designators, and the descriptions of the same elements may be omitted or mentioned briefly.

A semiconductor package according to FIG. 4 has a metal plate 270b having a different structure from the metal plate 270a of the semiconductor package illustrated in FIG. 3. The metal plate 270b may include a concave part and an edge part surrounding the concave part. The concave part corresponds to a recessed part on which the second semiconductor chip 110b is mounted. The edge part has a thickness greater than that of the concave part. The concave part may be formed by half-etching/partially-etching a center region of a metal plate having a uniform thickness. As a result, the second semiconductor chip 110b is provided on the concave part corresponding to the recessed region, so that the semiconductor package may be thinned.

The metal plate 270b may include one of various conductive metals (e.g., copper (Cu), aluminum (Al), nickel (Ni), chromium (Cr)) and any combination thereof. For example, the metal plate 270b may include copper.

In the semiconductor package illustrated in FIG. 4, the semiconductor chip 110b is mounted on the concave part of the metal plate 270b corresponding to the recessed region, so that the thickness of the metal plate 270b may be reduced. Thus, a thinner semiconductor package may be provided.

According to the semiconductor packages illustrated in FIGS. 3 and 4, the ground and/or the power of the first semiconductor chip 110a may be separated from the ground and/or the power of the second semiconductor chip 110b in the first wiring board 210. Thus, the interference phenomenon between the first and second semiconductor chips 110a and 110b may be minimized/reduced. As a result, semiconductor packages with improved reliability may be provided.

Additionally, the semiconductor packages illustrated in FIGS. 3 and 4 have a structure configured to shield electromagnetic interference of/by the first semiconductor chip 110a mounted on the wiring board 210 by a flip chip technique. Thus, electromagnetic interference shielding ability of the semiconductor packages for the first semiconductor chip 110a may be improved. As a result, semiconductor packages with improved reliability may be provided.

Moreover, the semiconductor packages illustrated in FIGS. 3 and 4 have a structure configured to reduce or minimize the number of the bonding wires 285a, 285bs and 285bg in the lower package. Thus, manufacturing processes of the semiconductor packages may be simplified and radiation noise may be reduced or minimized. As a result, various embodiments of the inventive concepts may provide semiconductor packages capable of improving reliability and of simplifying manufacturing processes.

Furthermore, the semiconductor packages illustrated in FIGS. 3 and 4 have a package-on-package (POP) structure. Thus, the semiconductor packages of FIGS. 3 and 4 may perform various functions and integration degrees of the semiconductor packages may be improved. As a result, high performance small semiconductor packages may be provided.

Figure 5:
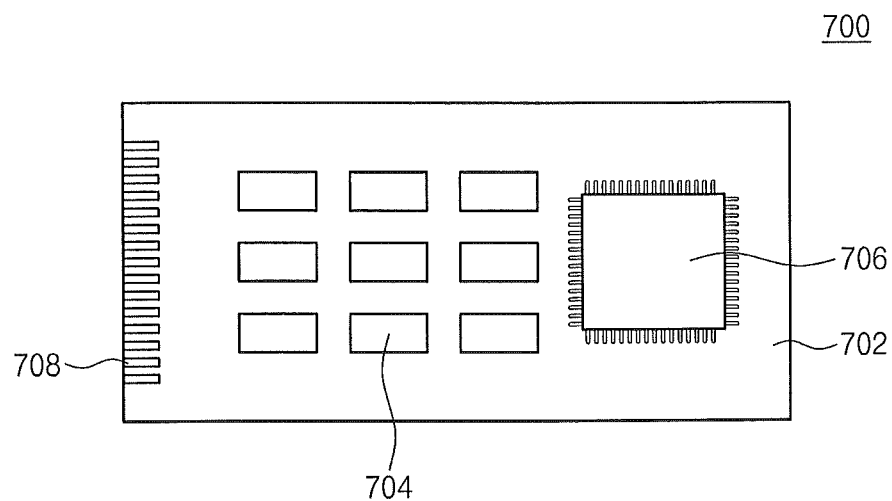
FIG. 5 is a plan view illustrating a package module according to example embodiments of the inventive concepts.

FIG. 5 is a plan view illustrating a package module according to example embodiments of the inventive concepts. Referring to FIG. 5, a package module 700 may include a module board 702 having external connection terminals 708, and a semiconductor chip 704 and a quad flat package (QFP) type semiconductor package 706 mounted on the module board 702. The semiconductor package 706 may include at least one of the semiconductor packages according to various embodiments of the inventive concepts. The package module 700 may be connected to an external electronic device through the external connection terminals 708.

Figure 6:
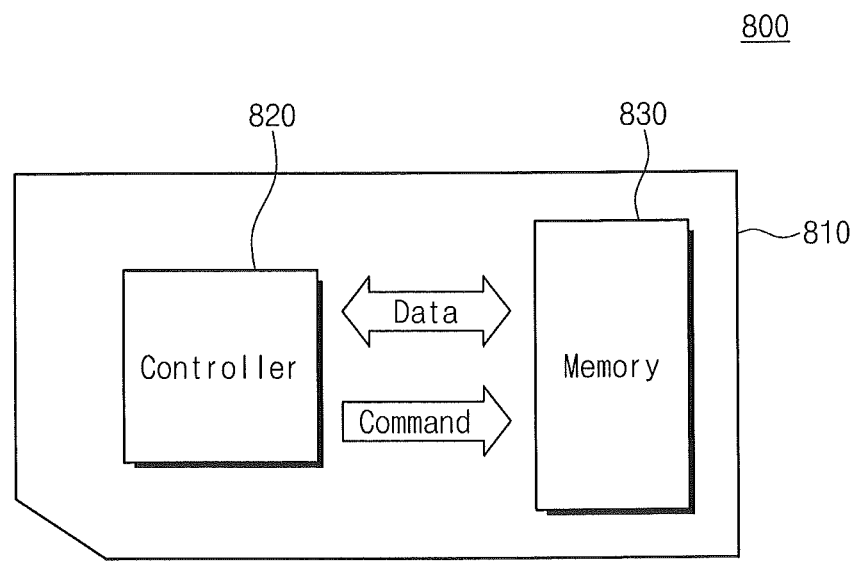
FIG. 6 is a schematic block diagram illustrating a memory card according to example embodiments of the inventive concepts.

FIG. 6 is a schematic block diagram illustrating a memory card according to example embodiments of the inventive concepts. Referring to FIG. 6, a memory card 800 may include a controller 820 and a memory device 830 that are disposed in a housing 810. The controller 820 may exchange electrical signals with the memory device 830. For example, the controller 820 and the memory device 830 may exchange data with each other in response to commands of the controller 820. Thus, the memory card 800 may store data in the memory device 830 or may output data from the memory device 830 to an external system.

The controller 820 and/or the memory device 830 may include at least one of the semiconductor packages according to FIGS. 1-5. For example, the controller 820 may include a system-in-package, and the memory device 830 may include a multi-chip package. Alternatively, the controller 820 and/or the memory device 830 may be a stack type package. The memory card 800 may be used as a data storage medium of various portable devices. For example, the memory card 800 may include a multimedia card (MMC) or a secure digital (SD) card.

Figure 7:
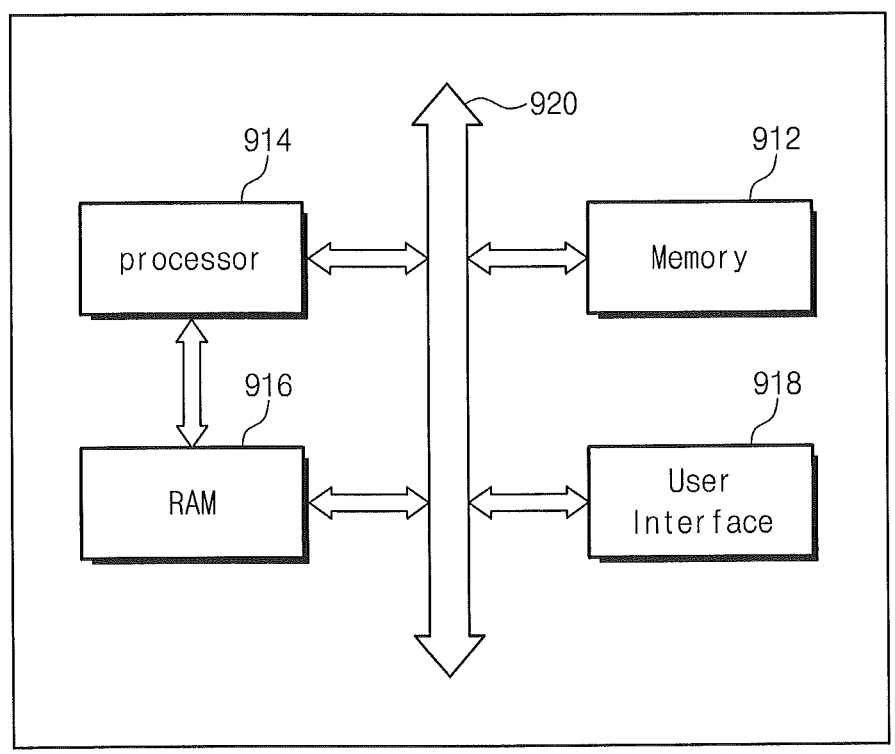
FIG. 7 is a schematic block diagram illustrating an electronic system according to example embodiments of the inventive concepts.

FIG. 7 is a schematic block diagram illustrating an electronic system according to example embodiments of the inventive concepts. Referring to FIG. 7, an electronic system 900 may include at least one of the semiconductor packages according to FIGS. 1-5. The electronic system 900 may include a mobile device or a computer. For example, the electronic system 900 may include a memory system 912, a processor 914, a random access memory (RAM) device 916, and a user interface unit 918. The memory system 912, the processor 914, the RAM device 916, and the user interface unit 918 may communicate with each other through a data bus 920. The processor 914 may execute a program and may control the electronic system 900. The RAM device 916 may be used as an operation/operating memory of the processor 914. For example, each of the processor 914 and the RAM device 916 may include a semiconductor package according to FIGS. 1-5. Alternatively, the processor 914 and the RAM device 916 may be included in one package. The user interface unit 918 may be used to input data in, or to output data from, the electronic system 900. The memory system 912 may store code/instructions for operation of the processor 914, data processed by the processor 914, or data input from an external system. The memory system 912 may include a controller and a memory device. The memory system 912 may include substantially the same structure as the memory card 800 of FIG. 6.

Figure 8:
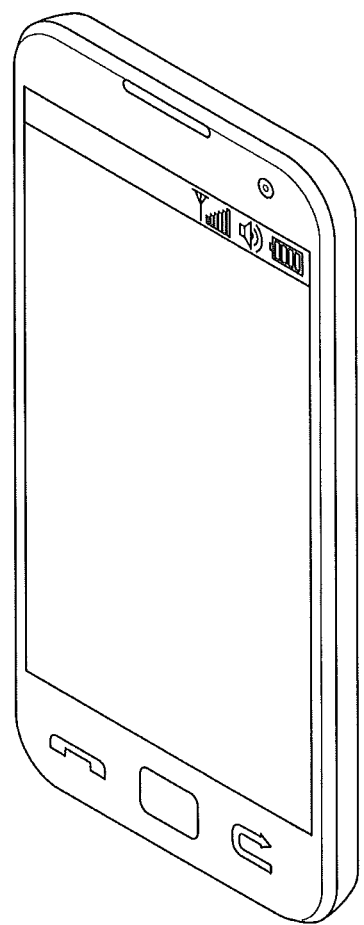
FIG. 8 is a perspective view illustrating an electronic device according to example embodiments of the inventive concepts.

The electronic system 900 of FIG. 7 may be applied to electronic control devices of various electronic devices. FIG. 8 illustrates a mobile phone 1000 that includes the electronic system 900 of FIG. 7. In some embodiments, the electronic system 900 of FIG. 7 may be applied to a portable notebook, an MP3 player, a navigator/navigation device, a solid state disk (SSD), a car, or a household appliance.

In a semiconductor package according to various embodiments of the inventive concepts, the ground and/or the power of the first semiconductor chip may be separated from the ground and/or the power of the second semiconductor chip in the wiring board. Thus, the interference phenomenon between the first and second semiconductor chips may be minimized/reduced. As a result, semiconductor packages with improved reliability may be provided.

Additionally, a semiconductor package according to various embodiments described herein may have a structure configured to shield the electromagnetic interference of the first semiconductor chip mounted on the wiring board by a flip chip technique. Thus, the electromagnetic interference shielding ability of the semiconductor package for the first semiconductor chip may be improved. As a result, semiconductor packages with improved reliability may be provided.

Moreover, the semiconductor package may have the structure configured to reduce or minimize the number of the bonding wires. Thus, the manufacturing processes of the semiconductor package may be simplified. As a result, a semiconductor package formed by simplified manufacturing processes may be provided.

Furthermore, a semiconductor package may have the second semiconductor chip mounted on a recessed region of the metal plate. Thus, the thickness of the metal plate may be reduced to provide a thinned semiconductor package.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
a wiring board;
a first semiconductor chip that is flip-chip mounted on a surface of the wiring board;
a metal layer on the first semiconductor chip, the metal layer comprising a first width that is wider than a second width of the first semiconductor chip;
a second semiconductor chip on the metal layer;
a first bonding wire configured to electrically connect the metal layer to a first ground interconnection of the wiring board; and
a second bonding wire configured to electrically connect the second semiconductor chip to a second ground interconnection of the wiring board, wherein the second ground interconnection is electrically isolated from the first ground interconnection.

2. The semiconductor package of claim 1, further comprising:
a first adhesive layer between the metal layer and the first semiconductor chip; and
a second adhesive layer between the metal layer and the second semiconductor chip.

3. The semiconductor package of claim 1, wherein the second semiconductor chip comprises a third width that is narrower than the first width of the metal layer.

4. The semiconductor package of claim 3, wherein the third width of the second semiconductor chip is substantially equal to or wider than the second width of the first semiconductor chip.

5. The semiconductor package of claim 1, wherein the metal layer comprises:
a recessed portion on which the second semiconductor chip is mounted; and
an edge portion adjacent the recessed portion, the edge portion comprising a first thickness that is thicker than a second thickness of the recessed portion.

6. The semiconductor package of claim 1,
wherein the surface of the wiring board comprises a first surface of the wiring board, and wherein the wiring board comprises:
first connection pads on the first surface; and
second connection pads on a second surface that is opposite the first surface.

7. The semiconductor package of claim 6,
wherein the first connection pads comprise:
a signal connection pad electrically connected to the first and second semiconductor chips and configured to provide electrical signal transmission; and
ground connection pads electrically connected to the first and second semiconductor chips and configured to provide grounding, and wherein the second connection pads comprise:
a signal external connection pad electrically connected to an external circuit and configured to provide electrical signal transmission; and
a ground external connection pad electrically connected to the external circuit and configured to provide grounding.

8. The semiconductor package of claim 6, further comprising external connection terminals on respective ones of the second connection pads.

9. The semiconductor package of claim 1, further comprising an underfill that is between the wiring board and the first semiconductor chip.

10. The semiconductor package of claim 6, further comprising a molding portion that is on the first surface of the wiring board, the first and second semiconductor chips, and the first and second bonding wires.

11. The semiconductor package of claim 10, wherein:
the wiring board comprises a wiring board of a lower package of the semiconductor package;
the semiconductor package further comprises an upper package; and
one of the first connection pads of the wiring board comprises a stack-connection pad that is electrically connected to the upper package.

12. The semiconductor package of claim 11, wherein:
the wiring board of the lower package comprises a first wiring board; and
the upper package comprises:
a second wiring board; and
at least one third semiconductor chip mounted on a surface of the second wiring board.

13. The semiconductor package of claim 12, wherein the first, second, and at least one third semiconductor chips are configured to perform different respective functions.

14. The semiconductor package of claim 12, wherein:
the molding portion comprises a first molding portion of the lower package; and
the upper package comprises a second molding portion on the surface of the second wiring board and on the at least one third semiconductor chip.

15. The semiconductor package of claim 12, wherein:
the surface of the second wiring board comprises a first surface of the second wiring board;
the second wiring board further comprises a second surface opposite the first surface of the second wiring board; and
the stack-connection pad of the first wiring board is electrically connected to the second surface of the second wiring board via a stack-connection terminal in an opening in the molding portion.

16. A semiconductor package comprising:
a wiring board;
a first semiconductor chip on the wiring board;
a metal layer, comprising a recessed portion, on the first semiconductor chip;
a second semiconductor chip on the recessed portion of the metal layer,
wherein the metal layer is between the first and second semiconductor chips, and
wherein the metal layer comprises an edge portion comprising a first thickness that is thicker than a second thickness of the recessed portion of the metal layer.

17. The semiconductor package of claim 16, wherein:
the first semiconductor chip is flip-chip mounted on the wiring board; and
the metal layer comprises a first width that is wider than a second width of the first semiconductor chip.

18. The semiconductor package of claim 17, further comprising:
a first bonding wire connected to the edge portion of the metal layer and to the wiring board;
a second bonding wire connected to the second semiconductor chip and to the wiring board; and
first and second ground interconnections in the wiring board,
wherein the first and second bonding wires are electrically connected to the first and second ground interconnections, respectively, and
wherein the second ground interconnection is electrically isolated from the first ground interconnection.

19. The semiconductor package of claim 18, wherein:
the metal layer extends continuously between the first and second semiconductor chips;
the first thickness of the edge portion of the metal layer is thicker than a third thickness of the first semiconductor chip; and
at least a portion of a sidewall of the second semiconductor chip faces an opposing sidewall of the edge portion of the metal layer.

20. The semiconductor package of claim 19, further comprising first and second semiconductor packages, wherein:
the wiring board comprises a first wiring board of the first semiconductor package, the first semiconductor package comprising the first and second semiconductor chips and the metal layer; and
the second semiconductor package comprises:
a second wiring board on the first semiconductor package; and
a third semiconductor chip on the second wiring board.

* * * * *